(12) United States Patent
Kobayashi (10) Patent No.: US 10,822,205 B2
(45) Date of Patent: Nov. 3, 2020

(54) OVERHEAD TRANSPORT VEHICLE

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 91 days.

(21) Appl. No.: 16/342,538

(22) PCT Filed: Sep. 21, 2017

(86) PCT No.: PCT/JP2017/034135
§ 371 (c)(1),
(2) Date: Apr. 17, 2019

(87) PCT Pub. No.: WO2018/079146
PCT Pub. Date: May 3, 2018

(65) Prior Publication Data
US 2019/0241406 A1 Aug. 8, 2019

(30) Foreign Application Priority Data

Oct. 25, 2016 (JP) .................................. 2016-208748

(51) Int. Cl.
| | |
|---|---|
| *B66C 13/06* | (2006.01) |
| *B66C 19/00* | (2006.01) |
| *B66C 11/00* | (2006.01) |
| *H01L 21/677* | (2006.01) |
| *B65G 1/04* | (2006.01) |

(52) U.S. Cl.
CPC ............... *B66C 13/06* (2013.01); *B65G 1/04* (2013.01); *B66C 11/00* (2013.01); *B66C 19/00* (2013.01); *H01L 21/67706* (2013.01); *H01L 21/67712* (2013.01); *H01L 21/67724* (2013.01); *H01L 21/67733* (2013.01)

(58) Field of Classification Search
CPC ......... H01L 21/67706; H01L 21/67712; H01L 21/67724; H01L 21/67733; H01L 21/67751; B65G 2201/0297; B65G 1/04; B66C 13/06; B66C 19/00; B66C 11/00
USPC .................................................. 414/626, 940
See application file for complete search history.

(56) References Cited

U.S. PATENT DOCUMENTS

| | | | |
|---|---|---|---|
| 7,328,812 B2 * | 2/2008 | Nakao ....................... | B66C 1/28 212/330 |
| 7,464,823 B2 * | 12/2008 | Nakao ..................... | B66C 13/06 212/274 |
| 10,192,764 B2 * | 1/2019 | Kobayashi .............. | B61B 15/00 |

(Continued)

FOREIGN PATENT DOCUMENTS

| | | |
|---|---|---|
| EP | 1 612 182 A1 | 1/2006 |
| JP | 2016-094263 A | 5/2016 |

*Primary Examiner* — Michael R Mansen
*Assistant Examiner* — Juan J Campos, Jr.
(74) *Attorney, Agent, or Firm* — Keating & Bennett, LLP (57) ABSTRACT

In an overhead transport vehicle, an elevator includes shock absorbers attached to belts, and a base including a holder. The shock absorbers each include a support below the base. The base is vertically movable with respect to each of the supports with vibration isolators. The shock absorbers are connected by a link that operates to ensure similarity of respective distances between the base and the support connected to each other in each of the shock absorbers.

8 Claims, 7 Drawing Sheets

(56) References Cited

U.S. PATENT DOCUMENTS

| | | | |
|---|---|---|---|
| 2006/0169663 A1* | 8/2006 | Nakao | B66C 1/28 |
| | | | 212/319 |
| 2006/0180565 A1* | 8/2006 | Nakao | B66C 13/06 |
| | | | 212/332 |
| 2016/0133488 A1 | 5/2016 | Tomida | |
| 2017/0243775 A1* | 8/2017 | Kobayashi | H01L 21/67379 |

* cited by examiner

OVERHEAD TRANSPORT VEHICLE

BACKGROUND OF THE INVENTION

1. Field of the Invention

One aspect of the present invention relates to an overhead transport vehicle.

2. Description of the Related Art

An overhead transport vehicle includes a body unit configured to travel along a track, and a lifting unit including a gripping unit configured to grip an article, the lifting unit configured to ascend and descend with respect to the body unit by winding and paying out a plurality of suspending members is known. For example, Japanese Unexamined Patent Publication No. 2016-94263 discloses an overhead transport vehicle in which shock-absorbing elements that are elastically deformable in the vertical direction are disposed between a lifting unit and a gripping unit. With the overhead transport vehicle thus configured, vibrations generated when a traveling body travels or when the lifting unit ascends and descends can be prevented from being transmitted to an article.

In the conventional overhead transport vehicle in which the shock-absorbing elements are disposed, transmission of vibrations to an article when the traveling body travels or when the lifting unit ascends and descends can be reduced. However, for example, rolling motion tends to occur in the lifting unit due to acceleration during travel or centrifugal force during travel on a curve. The rolling motion thus occurring tilts the lifting unit thereby causing the article to sway, and causes the problem that, for example, the article is brought into contact with a cover of the overhead transport vehicle or accuracy of transferring the article deteriorates.

SUMMARY OF THE INVENTION

In view of this, preferred embodiments of the present invention provide overhead transport vehicles that each reduces or prevents swaying of an article while reducing vibrations transmitted to the article.

An overhead transport vehicle according to one aspect of a preferred embodiment of the present invention is an overhead transport vehicle including a body to travel along a track, and an elevator including a gripper to grip an article and to be raised and lowered with respect to the body by a plurality of suspensions. The elevator includes a base to which the gripper is provided, and a plurality of shock absorbers, each including a support to support the base so as to be vertically movable from below in a vertical direction via a vibration-isolator, and to each of which at least one suspension is attached. The shock absorbers are connected by a link, and the link operates so as to ensure similarity of respective distances between the base and the supports in the shock absorbers connected to each other.

In the overhead transport vehicle thus configured, because the base is vertically movable with respect to each of the supports with the vibration-isolators, vibrations generated when the body travels or when the elevator ascends and descends are able to be prevented from being transmitted to the article. Furthermore, in the overhead transport vehicle thus configured, because the link operates so as to ensure similarity of respective distances between the base and the supports in the respective shock absorbers connected to each other, occurrence of rolling motion in the base is reduced or prevented. Thus, tilting of the base is able to be reduced or prevented, and swaying of the article is able to be reduced or prevented. Consequently, it is possible to reduce or prevent swaying of the article while reducing vibrations transmitted to the article.

In an overhead transport vehicle according to an aspect of a preferred embodiment of the present invention, the link may connect together two of the shock absorbers arranged in a direction orthogonal to both of a direction in which the body travels and the vertical direction.

In the overhead transport vehicle thus configured, rolling motion in a width direction (the direction orthogonal to both of the direction in which the body travels and the vertical direction) that occurs, for example, during travel on a curve or when the article is transferred in a lateral direction is able to be reduced or prevented.

In an overhead transport vehicle according to an aspect of a preferred embodiment of the present invention, the link may connect together two of the shock absorbers arranged in a direction in which the body travels.

In the overhead transport vehicle thus configured, rolling motion in a front-and-rear direction (the direction in which the body unit travels) that occurs, for example, due to acceleration or deceleration during travel is able to be reduced or prevented.

In an overhead transport vehicle according to an aspect of a preferred embodiment of the present invention, the link may connect together two of the shock absorbers arranged in a direction orthogonal to both of a direction in which the body travels and the vertical direction, and also may connect together two of the shock absorbers arranged in the direction in which the body travels.

In the overhead transport vehicle thus configured, rolling motion in the width direction that occurs when, for example, during travel on a curve or when the article is transferred in the lateral direction is able to be reduced or prevented, and also rolling motion in the front-and-rear direction (the direction in which the body unit travels) that occurs, for example, due to acceleration or deceleration during travel is able to be reduced or prevented. Furthermore, it is possible to absorb tilting of the base caused by at least one of change in position of the center of gravity of the article and tolerance thereof in a state in which the article is gripped or in a state in which the article is not gripped, and thus the base is able to be kept level.

In an overhead transport vehicle according to an aspect of a preferred embodiment of the present invention, the elevator may be suspended by four suspensions from the body, one of the shock absorbers may further include a swing that is swingably provided to the corresponding support, and two of the suspensions may be attached to the swing.

In the overhead transport vehicle thus configured, the elevator is suspended by the four suspensions, but is in a state of being suspended substantially at three locations by two joints between the elevator and two suspensions that are not attached to the swing and one swing that is swingably connected in the elevator. Thus, an effect similar to that in the case of being suspended by three suspensions is able to be obtained, such that the elevator is more stably suspended. Furthermore, even if one suspension has been cut for some reason, the suspended state is able to be maintained, and thus the safety level is able to be increased more than in the case of being actually suspended by three suspensions.

According to an aspect of a preferred embodiment of the present invention, it is possible to reduce tilting of the elevator (gripper) while reducing vibrations transmitted to the article.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the drawings. In the description of the drawings, like elements are designated by like reference signs, and duplicated explanation is omitted.

Figure 1:
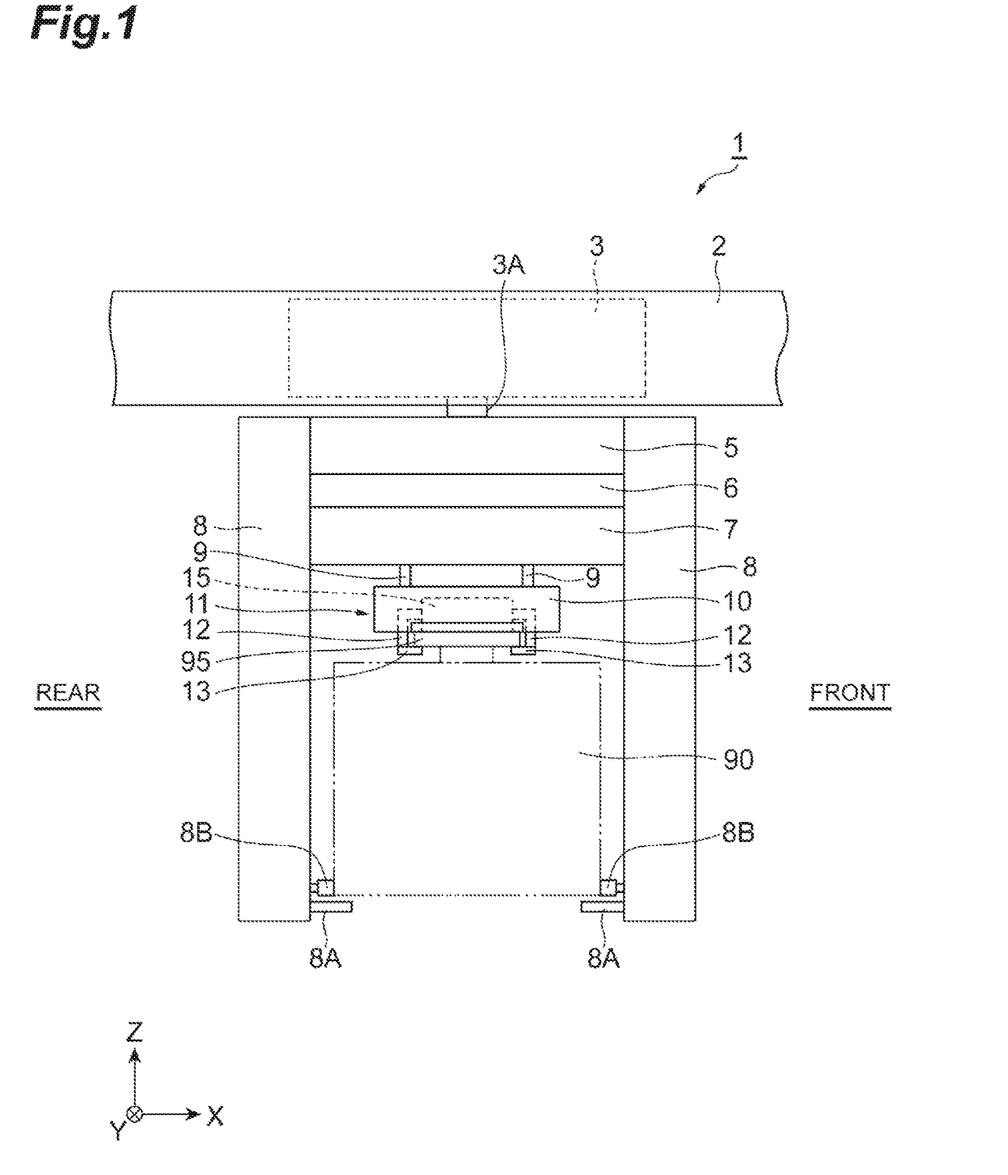
FIG. 1 is a front view illustrating an overhead transport vehicle according to a preferred embodiment of the present invention.
Figure 2:
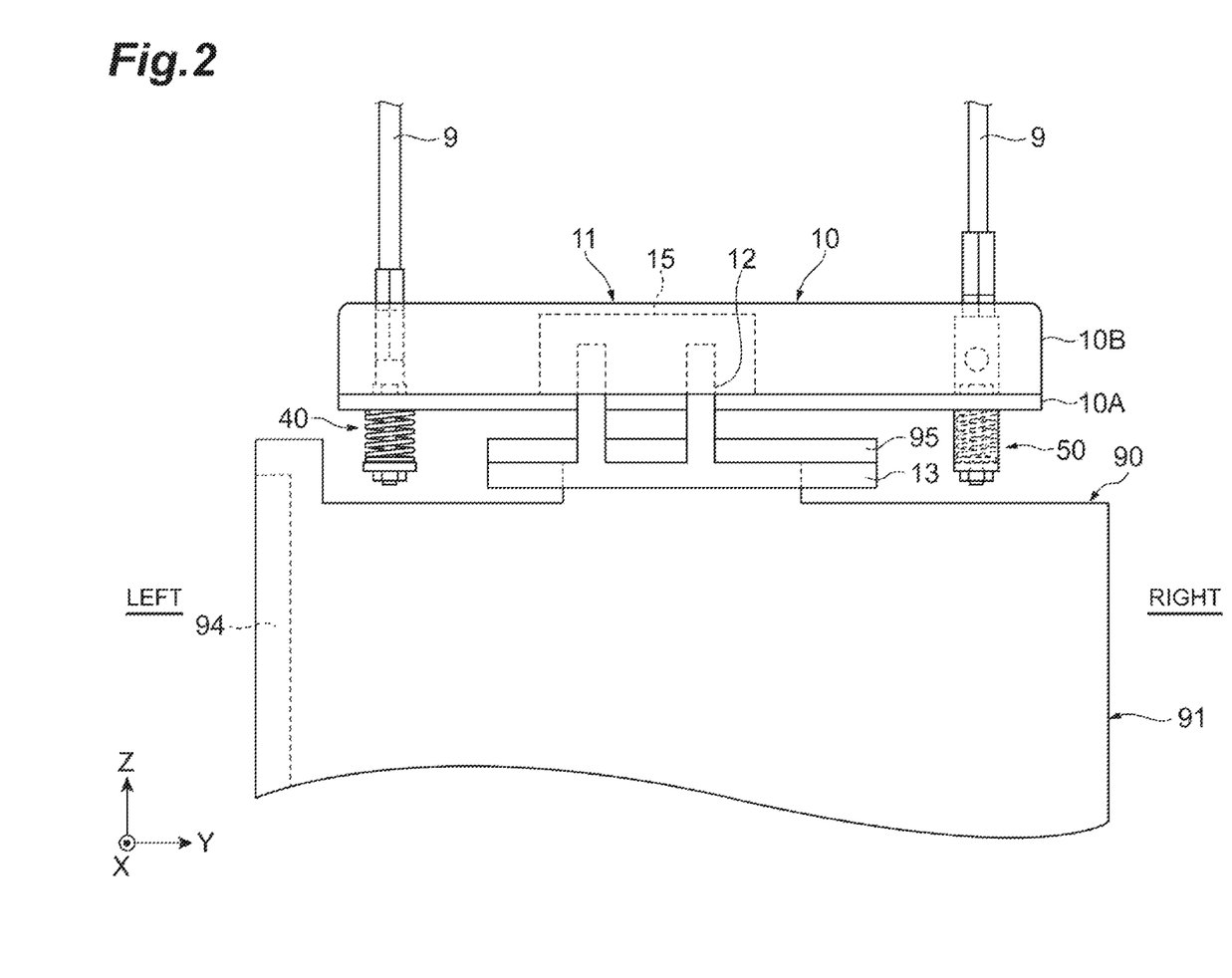
FIG. 2 is a side view of the overhead transport vehicle in FIG. 1 when viewed from front.

FIG. 1 is a front view illustrating an overhead transport vehicle according to the present preferred embodiment, and FIG. 2 is a side view of the overhead transport vehicle in FIG. 1 when viewed from front. In FIG. 1 and FIG. 2, illustration of a link mechanism 70 is omitted. This overhead transport vehicle 1 depicted in FIG. 1 travels along a traveling rail 2 provided at a position higher than a floor, e.g., at a ceiling of a clean room. The overhead transport vehicle 1 conveys a front opening unified pod (FOUP) (article) 90 as an article between a storage facility and a predetermined load port, for example. The FOUP 90 accommodates a plurality of semiconductor wafers, reticles, or the like. The FOUP 90 includes a flange 95 to be held by the overhead transport vehicle 1.

In the following description, the left-and-right direction (X-axis direction) in FIG. 1 is defined as the front-and-rear direction of the overhead transport vehicle 1 for convenience in description. The up-and-down direction in FIG. 1 is defined as the up-and-down (vertical) direction (Z-axis direction) of the overhead transport vehicle 1. The direction into the page of FIG. 1 is defined as the left-and-right direction or the width direction (Y-axis direction) of the overhead transport vehicle 1. The X-axis, the Y-axis, and the Z-axis are orthogonal to each other.

Figure 5:
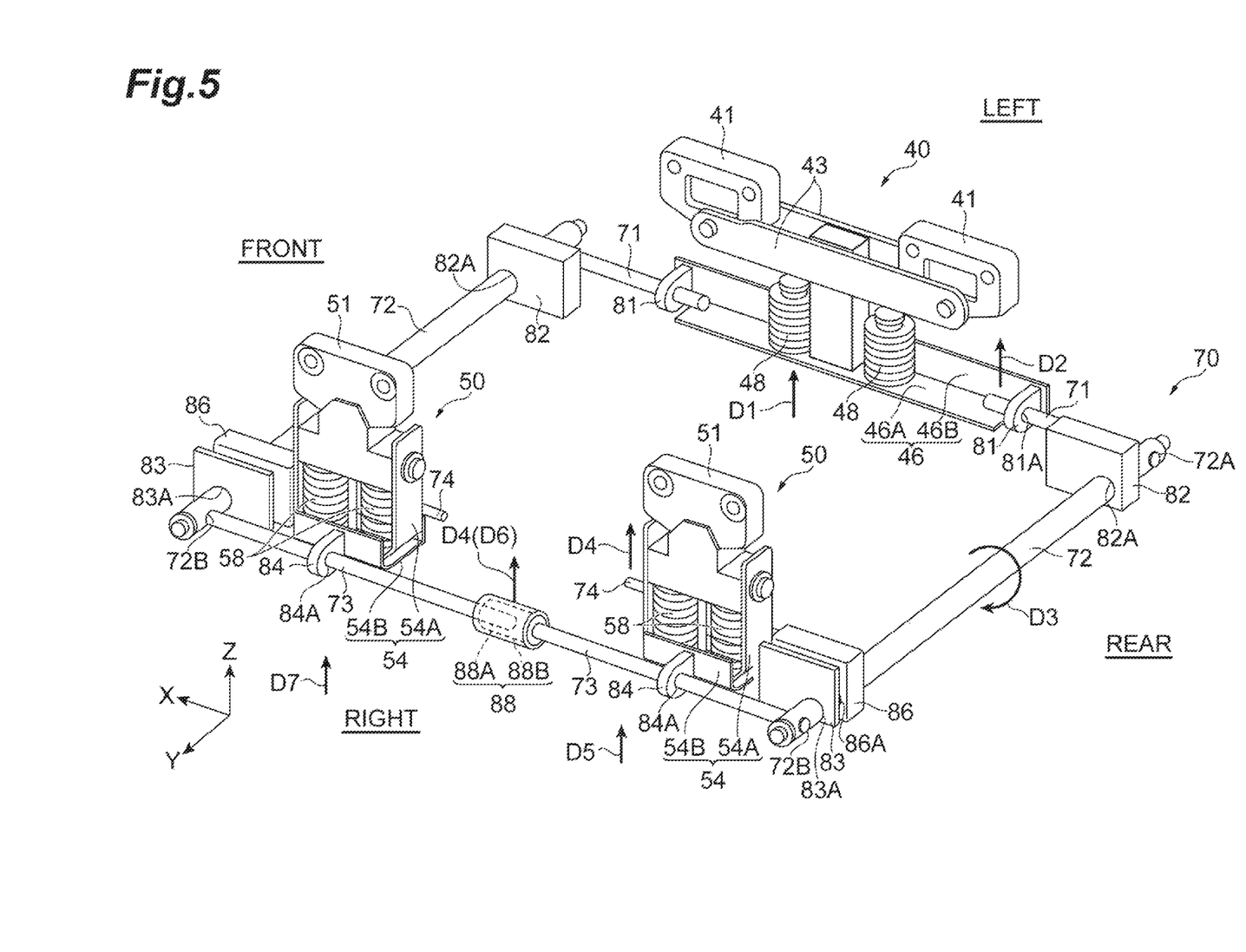
FIG. 5 is a perspective view of a link mechanism.

As depicted in FIG. 1, the overhead transport vehicle 1 includes a traveling drive unit 3, a horizontal drive unit (body unit or body) 5, a rotary drive unit (body unit or body) 6, a lifting drive unit (body unit or body) 7, a lifting device (lifting unit or elevator) 10, a holding device (gripping unit or gripper) 11, first shock-absorbing mechanisms (shock absorbers) 50 (see FIG. 5), a second shock-absorbing mechanism (shock absorber) 40 (see FIG. 5), and the link mechanism (link) 70 (see FIG. 5). In the overhead transport vehicle 1, a pair of covers 8 and 8 is provided in the front-and-rear direction so as to cover the horizontal drive unit 5, the rotary drive unit 6, the lifting drive unit 7, the lifting device 10, and the holding device 11. The pair of covers 8 and 8 define a space for accommodating a FOUP 90 below the holding device 11 in a state in which the lifting device 10 has ascended to its ascending end. Fall-preventing mechanisms 8A prevent a FOUP 90 held by the holding device 11 from falling in the state in which the lifting device 10 has ascended to the ascending end. Swaying suppression mechanisms 8B suppress swaying of the FOUP 90 held by the holding device 11 in the front-and-rear direction (traveling direction) and the left-and-right direction of the overhead transport vehicle 1 during travel.

The traveling drive unit 3 moves the overhead transport vehicle 1 along the traveling rail 2. The traveling drive unit 3 is disposed inside the traveling rail 2. The traveling drive unit 3 drives a roller (not depicted) to travel on the traveling rail 2. To the under portion of the traveling drive unit 3, the horizontal drive unit 5 is disposed with a shaft 3A interposed therebetween. The horizontal drive unit 5 moves the rotary drive unit 6, the lifting drive unit 7, and the lifting device 10 in a direction (left-and-right direction) orthogonal to the extending direction of the traveling rail 2 in a horizontal plane. The rotary drive unit 6 rotates the lifting drive unit 7 and the lifting device 10 in a horizontal plane. The lifting drive unit 7 raises and lowers the lifting device 10 by winding and paying out four belts (suspending members or suspensions) 9. As the belts 9 in the lifting drive unit 7, appropriate suspending members such as wires and ropes may be used.

As depicted in FIG. 1 and FIG. 2, the lifting device 10 in the present preferred embodiment is able to be raised and lowered by the lifting drive unit 7, and defines and functions as a lifting platform in the overhead transport vehicle 1. The lifting device 10 includes the first shock-absorbing mechanisms 50 and the second shock-absorbing mechanism 40 as a plurality of shock-absorbing mechanisms (shock absorbers) to which four belts 9 are attached, a base portion 10A to which the holding device 11 is provided, and a cover portion 10B covering the base portion 10A. The holding device 11 holds a FOUP 90. The holding device 11 includes a pair of L-shaped arms 12 and 12, hands 13 and 13 fixed to the respective arms 12 and 12, and an opening/closing mechanism 15 to open and close the pair of arms 12 and 12.

The pair of arms 12 and 12 is provided to the opening/closing mechanism 15. The opening/closing mechanism 15 moves the pair of arms 12 and 12 in a direction coming closer to each other and in a direction separating apart from each other. By operation of the opening/closing mechanism 15, the pair of arms 12 and 12 is moved forward and backward in the front-and-rear direction. By this operation, the pair of hands 13 and 13 fixed to the arms 12 and 12 is opened and closed. In the present preferred embodiment, the height position of the holding device 11 (lifting device 10) is adjusted such that the holding surface of each hand 13 is positioned lower than the height of the lower surface of the flange 95 when the pair of hands 13 and 13 is in an open state. In this state, when the pair of hands 13 and 13 is brought into a closed state, the holding surfaces of the hands 13 and 13 are moved forward below the lower surface of the flange 95, and the lifting device is raised in this state, such that the flange 95 is held (gripped) by the pair of hands 13 and 13, and the FOUP 90 is supported.

Figure 3:
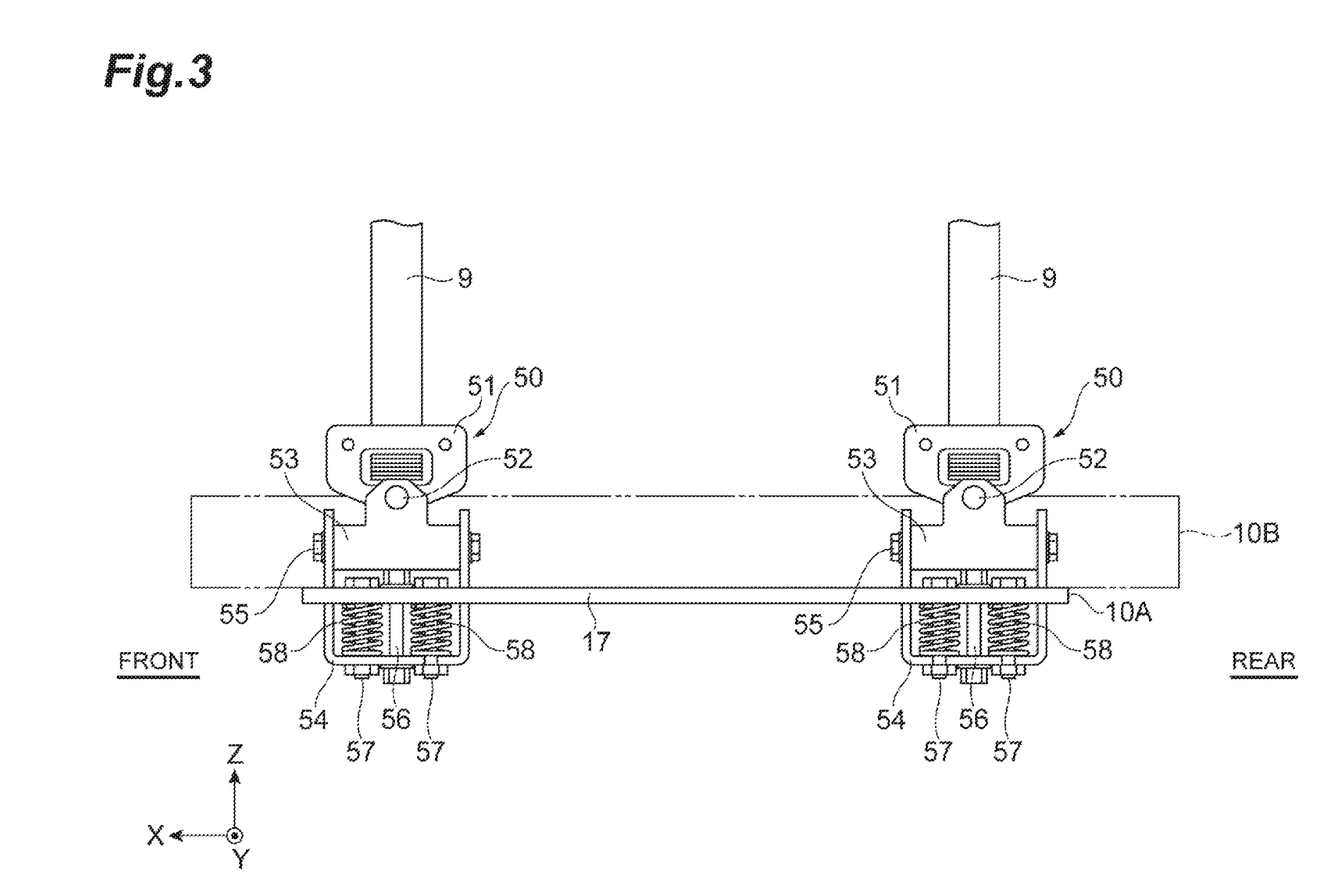
FIG. 3 is a front view of first shock-absorbing mechanisms when viewed from right.
Figure 4:
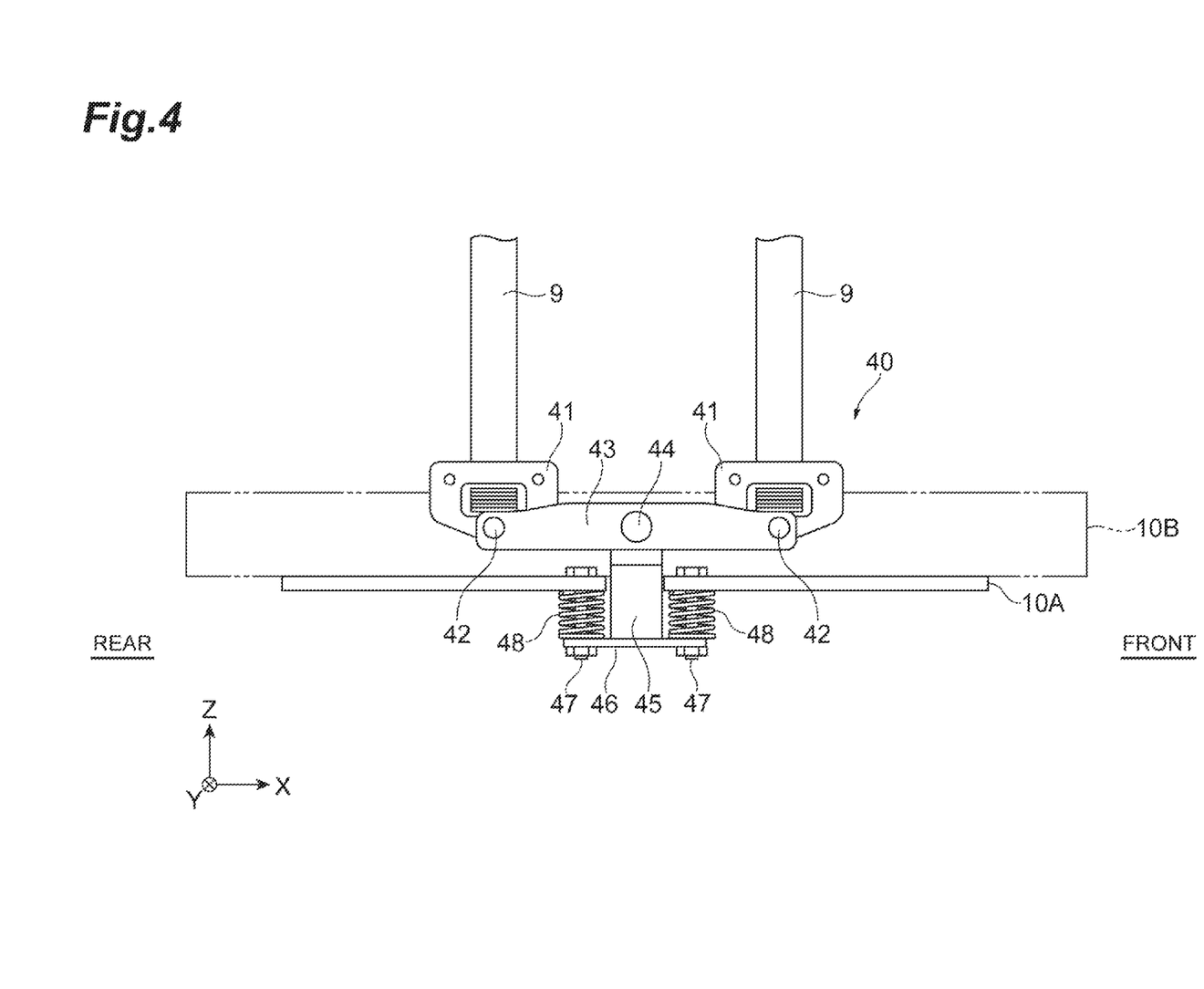
FIG. 4 is a front view of a second shock-absorbing mechanism when viewed from left.

FIG. 3 is a front view illustrating a schematic configuration of the first shock-absorbing mechanisms, and FIG. 4 is a front view illustrating a schematic configuration of the second shock-absorbing mechanism. In FIG. 3, illustration of a portion (second support member 54B) of a first body member 54 described later and the link mechanism 70 connected to the first shock-absorbing mechanisms 50 is omitted for convenience in description. In FIG. 4 also, illustration of a portion (fourth support member 46B) of a fourth body member 46 described later and the link mechanism 70 connected to the second shock-absorbing mechanism 40 is omitted for convenience in description. As depicted in FIG. 3 and FIG. 4, the first shock-absorbing mechanisms 50 and the second shock-absorbing mechanism 40 are mechanisms coupling the belts 9 to the lifting device 10 (see FIG. 1), and are mechanisms that prevent vibrations, generated when the traveling drive unit 3 travels or when the lifting device 10 ascends and descends, from being transmitted to the FOUP 90.

As depicted in FIG. 2, the first shock-absorbing mechanisms 50 are provided on the right side of the lifting device in the left-and-right direction. The first shock-absorbing mechanisms 50 are disposed at two locations in the front-and-rear direction as depicted in FIG. 3. Each first shock-absorbing mechanism 50 includes a connecting member 51, a swingable member 53, the first body member (support portion or support) 54, a second body member 56, first shaft portions 57 and 57, and first spring members (vibration-isolating portions or vibration isolators) 58 and 58.

The connecting member 51 is a member attached to the corresponding belt 9. The swingable member 53 is a member connected to the connecting member 51. The swingable member 53 is rotatably connected to the connecting member 51 via a first pin member 52. The first body member 54 is a substantially U-shaped member, the upper end of which is open, and the bottom portion thereof is flat in the horizontal direction. Upper ends of the first body member 54 are connected to both ends of the swingable member 53 by a bolt 55. The first body member 54 includes a first support member 54A (see FIG. 5 and FIG. 6) and a second support member 54B (see FIG. 5 and FIG. 6). The first support member 54A supports the first spring members 58 and 58 from below. The second support member 54B is orthogonal to the first support member 54A.

The second body member 56 couples together substantially central portions of the swingable member 53 and the first body member 54 in the front-and-rear direction. The first shaft portions 57 and 57 are rod-shaped and extend upward from the first body member 54, and are disposed so as to sandwich the second body member 56 in the front-and-rear direction. The first spring members 58 and 58 are compression coil springs having a predetermined spring constant, and through which the pair of first shaft portions 57 and 57 is each disposed. On the upper ends of the pair of first spring members 58 and 58, the base portion 10A is disposed so as to be in contact therewith. Each first spring member 58 presses the base portion 10A upward toward a side opposite to a gripping direction of the FOUP 90 (lower side in the vertical direction). The first spring member 58 as a vibration-isolating portion plays a role in reducing vibrations transmitted between members that are in contact with each other.

As depicted in FIG. 2, the second shock-absorbing mechanism 40 is provided on the left side of the lifting device 10 in the left-and-right direction. The second shock-absorbing mechanism 40 is disposed near a central portion thereof in the front-and-rear direction as depicted in FIG. 4. The second shock-absorbing mechanism 40 includes connecting members 41 and 41, a swingable member (swingable portion or swing) 43, a third body member 45, the fourth body member (support portion or support) 46, second shaft portions 47 and 47, and second spring members (vibration-isolating portions or vibration-isolators) 48 and 48.

The connecting members 41 and 41 are members to which the belts 9 and 9 are attached. The swingable member 43 is a member coupling the connecting members 41 and 41 in a pair to the third body member 45. The pair of connecting members 41 and 41 and the swingable member 43 are connected so as to be rotatable in both directions, and are connected together via a pair of third pin members 42 and 42. The swingable member 43 and the third body member 45 are connected together via a fourth pin member 44. The fourth body member 46 is a plate member connected to the lower end of the third body member 45 and extending in the horizontal direction. The fourth body member 46 has a third support member 46A (see FIG. 5 and FIG. 6) and a fourth support member 46B (see FIG. 5 and FIG. 6). The third support member 46A supports the second spring members 48 and 48 from below. The fourth support member 46B is a member orthogonal to the third support member 46A.

The second shaft portions 47 and 47 are rod-shaped members extending upward from the fourth body member 46, and are disposed so as to sandwich the third body member 45 in the front-and-rear direction. The second spring members 48 and 48 in a pair are compression coil springs having a predetermined spring constant, and through which the pair of second shaft portions 47 and 47 is each disposed. On the upper ends of the pair of second shaft portions 47 and 47, the base portion 10A is disposed so as to be in contact therewith. Each second spring member 48 presses the base portion 10A upward toward the side opposite to the gripping direction of the FOUP 90 (lower side in the vertical direction). The second spring member 48 as a vibration-isolating portion plays a role in reducing vibrations transmitted between members that are in contact with each other.

Figure 6:
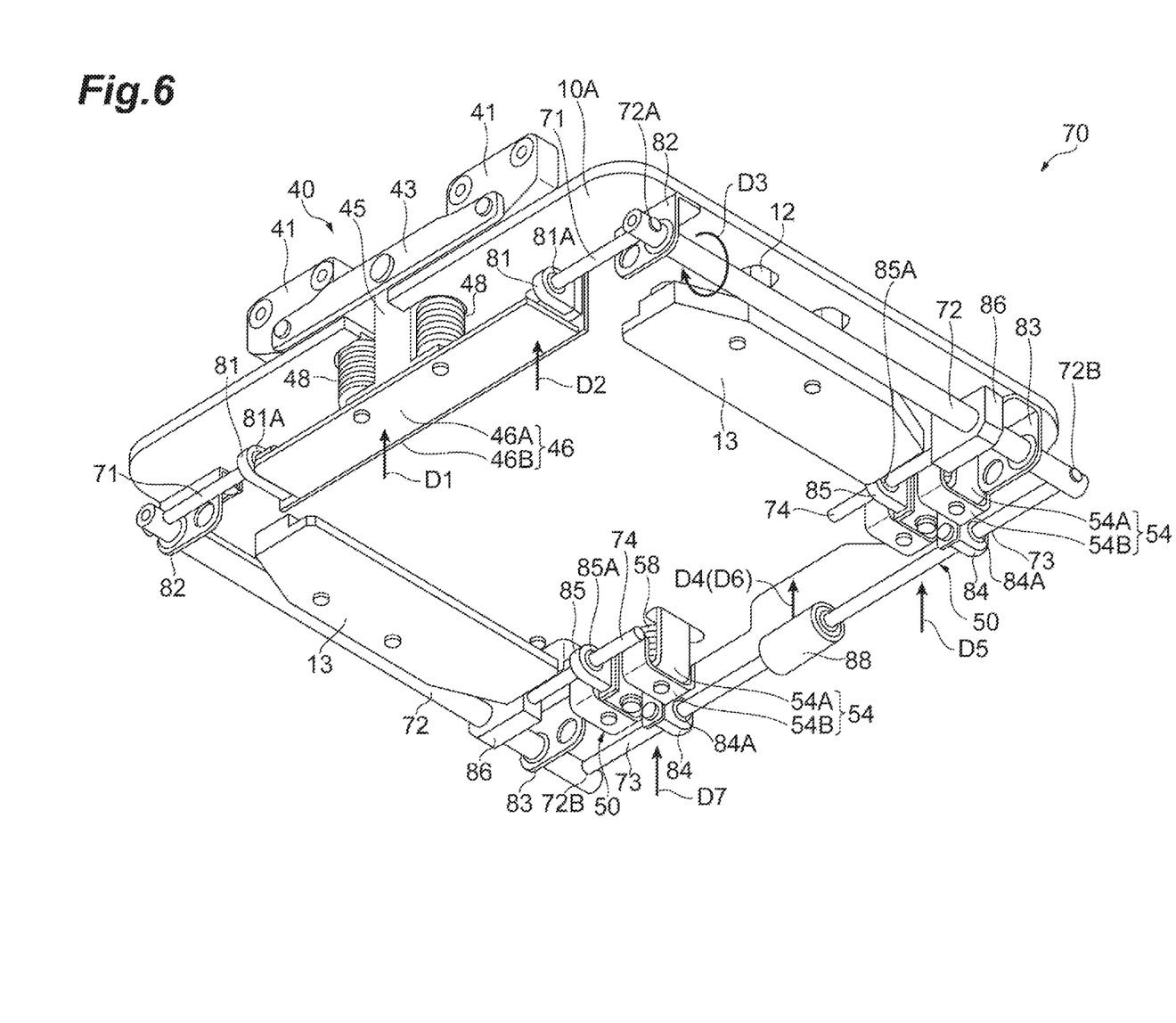
FIG. 6 is a perspective view of the link mechanism disposed on the back side of a base portion.
Figure 7:
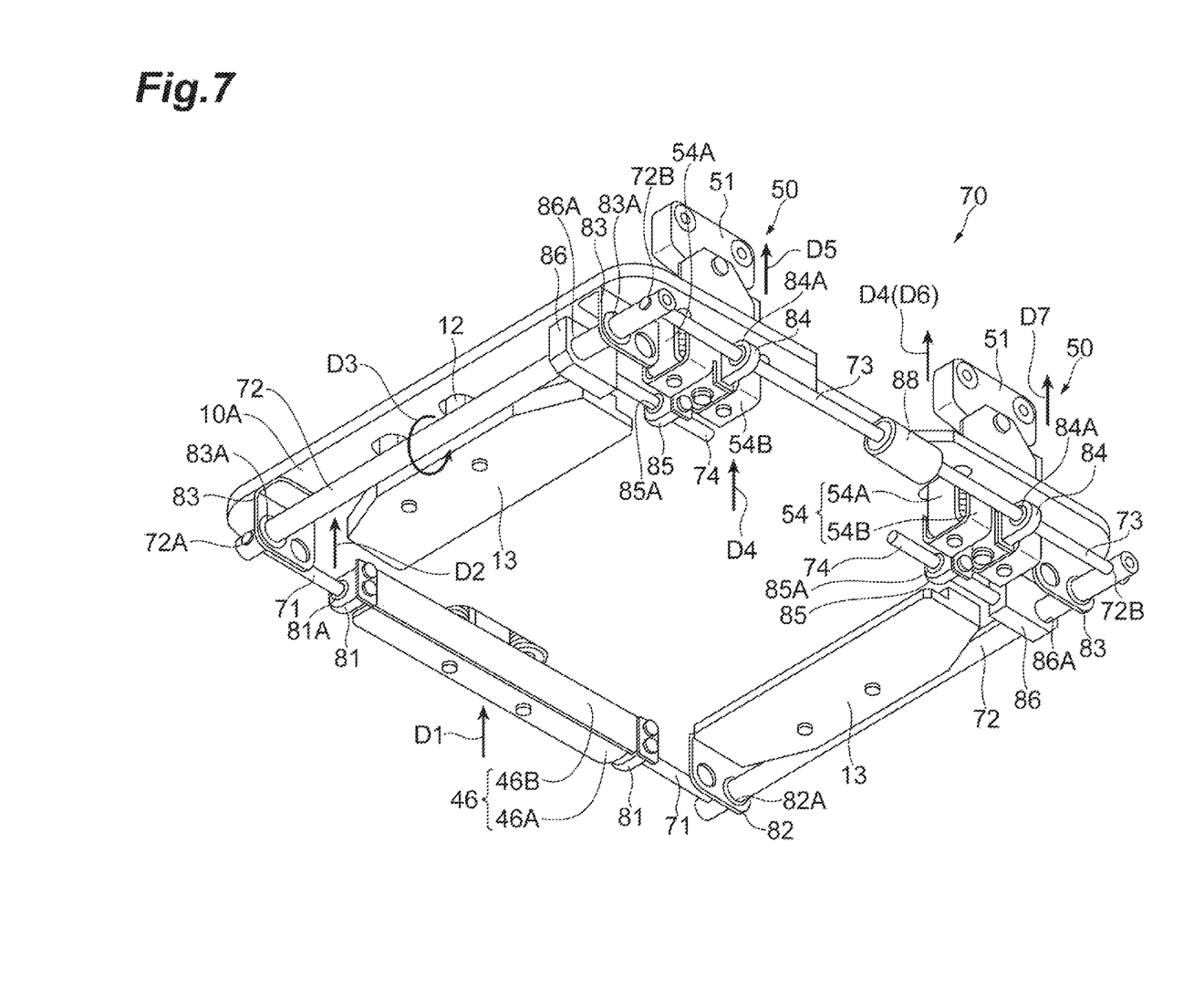
FIG. 7 is a perspective view of the link mechanism disposed on the back side of the base portion.

As depicted in FIG. 5 to FIG. 7, the link mechanism 70 connects together the two first shock-absorbing mechanisms 50 and the second shock-absorbing mechanism 40 that are arranged in the left-and-right direction (width direction) orthogonal to both of the front-and-rear direction (traveling direction) and the up-and-down direction (vertical direction), and also connects together the two first shock-absorbing mechanisms 50 and 50 arranged in the front-and-rear direction. The link mechanism 70 operates so as to bring, closer to each other, the distances between the base portion 10A and the first body member 54 in each first shock-absorbing mechanism 50 and the distance between the base portion 10A and the fourth body member 46 in the second shock-absorbing mechanism 40. The link mechanism 70 also operates so as to bring, closer to each other, the distance between the base portion 10A and the first body member 54 in the first shock-absorbing mechanism 50 disposed on the left side and the distance between the base portion 10A and the first body member 54 in the first shock-absorbing mechanism 50 disposed on the right side. The following describes details of the link mechanism 70.

The link mechanism 70 includes first shafts 71, second shafts 72, third shafts 73, fourth shafts 74, first bushings 81, first blocks 82, second blocks 83, second bushings 84, third bushings 85, fixing portions 86, and a coupling portion 88.

The first shafts 71 are supported by the first bushings 81 fixed to the fourth support member 46B in the second shock-absorbing mechanism 40, and extend in the front-and-rear direction. Each first shaft 71 is disposed through a through hole 81A of the corresponding first bushing 81, and is rotatable with respect to the first bushing 81 and slidable in the axial direction. Material of the first bushing 81 is appropriately selected such that the first shaft 71 has a certain rotatability and a certain slidability. The two first shafts 71 arranged in the front-and-rear direction are disposed substantially in a straight line in the front-and-rear direction. The respective first shafts 71 are disposed, in the front-and-rear direction, in line with the second shaft portions 47 and 47 (see FIG. 4) each disposed through the pair of second spring members 48 and 48.

The third shafts 73 are supported by the second bushings 84 fixed to the second support members 54B in the first shock-absorbing mechanisms 50, and extend in the front-and-rear direction. Each third shaft 73 is disposed through a through hole 84A of the corresponding second bushing 84, and is rotatable with respect to the second bushing 84 and slidable in the axial direction. The fourth shafts 74 are supported by the third bushings 85 fixed to the second support members 54B in the first shock-absorbing mechanisms 50, and extend in the front-and-rear direction. Each fourth shaft 74 is disposed through a through hole 85A of the corresponding third bushing 85, and is rotatable with respect to the third bushing 85 and slidable in the axial direction. Materials of the second bushing 84 and the third bushing 85 are appropriately selected in the same manner as for the first bushing 81 such that the third shaft 73 and the fourth shaft 74 have certain abilities to rotate and slide.

Each third shaft 73 and the corresponding fourth shaft 74 are disposed in parallel to each other with the corresponding first shock-absorbing mechanism 50 interposed therebetween. More specifically, when a line in the front-and-rear direction that passes through the first shaft portions 57 and 57 each disposed through the pair of first spring members 58 and 58 is defined as an imaginary line, the third shaft 73 and the fourth shaft 74 are disposed so as to be symmetric with respect to this imaginary line. The two third shafts 73 and 73 arranged in the front-and-rear direction are disposed in a straight line in the front-and-rear direction, and are connected together by the coupling portion 88 described later in detail. The two fourth shafts 74 and 74 arranged in the front-and-rear direction are disposed in a straight line in the front-and-rear direction.

Each second shaft 72 is supported by the corresponding first block 82 and the corresponding second block 83 that are fixed to the bottom surface of the base portion 10A, and extends in the left-and-right direction. The second shaft 72 is disposed through a through hole 82A of the first block 82 and a through hole 83A of the second block 83, and is rotatable with respect to the first block 82 and the second block 83 and slidable in the axial direction.

One end of the second shaft 72 in the left-and-right direction is connected to the corresponding first shaft 71. Specifically, an end portion of the first shaft 71 is disposed through a through hole 72A in the second shaft 72. The other end of the second shaft 72 in the left-and-right direction is connected to the corresponding third shaft 73. Specifically, an end portion of the third shaft 73 is disposed through a through hole 72B formed in the second shaft 72. The second shaft 72 is also connected to the corresponding fourth shaft 74 between the first block 82 and the second block 83 in the left-and-right direction. The second shaft 72 is connected to the fourth shaft 74 via the corresponding fixing portion 86 fixed to the bottom surface of the base portion 10A. The fixing portion 86 absorbs attachment tolerance between the fourth shaft 74 and the second shaft 72.

When the overhead transport vehicle 1 is viewed from right, the third shaft 73 connected to the first shock-absorbing mechanism 50 disposed on the front side and the third shaft 73 connected to the first shock-absorbing mechanism 50 disposed on the rear side are connected together by the coupling portion 88. The coupling portion 88 is disposed at a position that is substantially the center between the two second bushings 84 and 84 arranged in the front-and-rear direction. The coupling portion 88 includes an inserted portion 88A having an inside diameter that is larger than the outside diameter of the third shaft 73 disposed on the front side. This third shaft 73 is fixed, for example, at one location in the inserted portion 88A with a support member such as resin. Thus, the third shaft 73 is provided so as to be movable in the up-and-down and left-and-right directions inside the inserted portion 88A.

Referring to FIG. 5 to FIG. 7, the following describes one example of operation of the link mechanism 70 coupling together the second shock-absorbing mechanism 40 and each first shock-absorbing mechanism 50 that are arranged in the left-and-right direction. For example, it is assumed that, due to centrifugal force during travel, force is applied to the second spring members 48 and 48 of the second shock-absorbing mechanism 40 on the left side. When the force is applied to the second spring members 48 and 48 of the second shock-absorbing mechanism 40, the second spring members 48 and 48 are compressed, and the fourth body member 46 is accordingly moved upward (arrow D1). In other words, the distance between the fourth body member 46 and the base portion 10A decreases. When the fourth body member 46 is moved upward, an end portion of each first shaft 71 fixed to the fourth body member 46 via the corresponding first bushing 81, on the side closer to the first bushing 81, is moved upward (arrow D2) with respect to the end portion thereof on the side connected to the corresponding second shaft 72.

When the end portion of the first shaft 71 on the side closer to the first bushing 81 is moved upward, the second shaft 72 is rotated clockwise (arrow D3). When the second shaft 72 is rotated clockwise, an end portion of the third shaft 73 connected thereto, on the side closer to the coupling portion 88, is moved upward (arrow D4) with respect to the end portion thereof on the side connected to the second shaft 72. Furthermore, when the second shaft 72 is rotated clockwise, an end portion of the fourth shaft 74 connected thereto, on the side opposite to the side connected to the second shaft 72, is moved upward (arrow D4) with respect to the end portion thereof on the side connected to the second shaft 72. Accordingly, the first body member 54 that is fixed to the third shaft 73 via the corresponding second bushing 84 and is also fixed to the fourth shaft 74 via the corresponding third bushing 85 is pushed upward (arrow D5). When the first body member 54 is pushed upward, the corresponding pair of first spring members 58 and 58 is compressed. In other words, the distance between the first body member 54 and the base portion 10A decreases.

In contrast, when the second spring members 48 and 48 are stretched and the fourth body member 46 is accordingly moved downward (direction opposite to the arrow D1), the end portion of the first shaft 71 on the side closer to the first bushing 81 is moved downward (direction opposite to the arrow D2) with respect to the end portion thereof on the side connected to the second shaft 72. When the end portion of the first shaft 71 on the side closer to the first bushing 81 is moved downward, the second shaft 72 is rotated counterclockwise (direction opposite to the arrow D3). When the second shaft 72 is rotated counterclockwise, the end portion of the third shaft 73 on the side closer to the coupling portion 88 is moved downward (direction opposite to the arrow D4) with respect to the end portion thereof on the side connected to the second shaft 72, and the end portion of the fourth shaft 74 on the side opposite to the side connected to the second shaft 72 is moved downward (direction opposite to the arrow D4) with respect to the end portion thereof on the side connected to the second shaft 72. Accordingly, the first body member 54 is pushed downward (direction opposite to the arrow D5), and the pair of first spring members 58 and 58 is stretched.

As described above, in the link mechanism 70 coupling together the second shock-absorbing mechanism 40 and each first shock-absorbing mechanism 50 that are arranged in the left-and-right direction, when spring members of one of the second shock-absorbing mechanism 40 and the first shock-absorbing mechanism 50 are compressed or stretched, the corresponding second shaft 72 is rotated, in response to this compression or stretch, about the corresponding first block 82 and the corresponding second block 83 that are fixed to the bottom surface of the base portion 10A, such that spring members of the other of the second shock-absorbing mechanism 40 and the first shock-absorbing mechanism 50 are compressed or stretched. In other words, when a difference arises between the distance between the base portion 10A and the fourth body member 46 and the distance between the base portion 10A and the corresponding first body member 54 in the second shock-absorbing mechanism 40 and the first shock-absorbing mechanism 50 that are connected to each other, the link mechanism 70 operates so as to bring, closer to each other, the distance between the base portion 10A and the fourth body member 46 and the distance between the base portion 10A and the first body member 54 in the second shock-absorbing mechanism 40 and the first shock-absorbing mechanism 50 that are connected to each other.

The link mechanism 70 includes the second shaft 72 to produce a stress (torsion stress) when a difference arises between the distance between the base portion 10A and the fourth body member 46 and the distance between the base portion 10A and the first body member 54 in the second shock-absorbing mechanism 40 and the first shock-absorbing mechanism 50 that are connected to each other. Reaction force against the stress produced in the second shaft 72 acts as a force that brings, closer to each other, the distance between the base portion 10A and the fourth body member 46 and the distance between the base portion 10A and the first body member 54 in the second shock-absorbing mechanism 40 and the first shock-absorbing mechanism 50 that are connected to each other.

The following describes one example of operation of the link mechanism 70 coupling together the first shock-absorbing mechanisms 50 arranged in the front-and-rear direction. For example, it is assumed that, due to acceleration or deceleration during travel, force is applied to the first spring members 58 and 58 of the first shock-absorbing mechanism 50 on the rear side. When the force is applied to the first spring members 58 and 58 of the first shock-absorbing mechanism 50, the first spring members 58 and 58 are compressed, and the corresponding first body member 54 is accordingly moved upward (arrow D5). In other words, the distance between the first body member 54 and the base portion 10A decreases. When the first body member 54 is moved upward (arrow D5), an end portion of the third shaft 73 fixed to the first body member 54 via the corresponding second bushing 84, on the side closer to the coupling portion 88, is moved upward (arrow D6) with respect to the end portion thereof on the side connected to the corresponding second shaft 72.

When the coupling portion 88 is moved upward (arrow D6), an end portion of the other third shaft 73 connected to the coupling portion 88 (the third shaft 73 disposed on the left side in FIG. 5), on the side closer to the coupling portion 88, is also moved upward (arrow D6) with respect to the end portion thereof on the side connected to the corresponding second shaft 72. Accordingly, the first body member 54 that is fixed to the third shaft 73 via the second bushing 84 of the first shock-absorbing mechanism 50 on the front side is pushed upward (arrow D7). When the first body member 54 is pushed upward, the corresponding pair of the first spring members 58 and 58 is compressed. In other words, the distance between the first body member 54 and the base portion 10A decreases.

In contrast, when the first spring members 58 and 58 of the first shock-absorbing mechanism 50 on the front side are stretched and the first body member 54 is accordingly moved downward (direction opposite to the arrow D5), the end portion of the corresponding third shaft 73 on the side closer to the coupling portion 88 is moved downward (direction opposite to the arrow D6) with respect to the end portion thereof on the side connected to the corresponding second shaft 72. When the coupling portion 88 is moved downward, an end portion of the other third shaft 73 connected to the coupling portion 88 on the side closer to the coupling portion 88 is also moved downward (direction opposite to the arrow D6) with respect to the end portion thereof on the side connected to the corresponding second shaft 72. Accordingly, the first body member 54 of the first shock-absorbing mechanism 50 on the front side is pushed downward (direction opposite to the arrow D7). When the first body member 54 is pushed downward, the corresponding pair of first spring members 58 and 58 is stretched.

As described above, in the link mechanism 70 coupling together the first shock-absorbing mechanisms 50 arranged in the front-and-rear direction, when one of the first spring members 58 and 58 of one of the first shock-absorbing mechanisms 50 is compressed or stretched, in a manner supported by the coupling portion 88 and following the movement of the corresponding third shaft 73, the other third shaft 73 is moved, such that the first spring members 58 and 58 of the other of the first shock-absorbing mechanisms 50 are compressed or stretched. In other words, the link mechanism 70 operates so as to ensure similarity of respective distances between the base portion 10A and the first body members 54 and 54 in the first shock-absorbing mechanisms 50 that are connected to each other.

The link mechanism 70 includes the third shafts 73 configured to produce a stress when a difference arises between the distances between the base portion 10A and the first body members 54 in the first shock-absorbing mechanisms 50 that are connected to each other. Reaction force against the stress produced in the third shafts 73 acts as a force that ensure similarity of respective distances between the base portion 10A and the first body members 54 in the first shock-absorbing mechanisms 50 that are connected to each other.

The following describes functional effects of the overhead transport vehicle 1 according to the present preferred embodiment described above. In the overhead transport vehicle 1 according to the present preferred embodiment, because the base portion 10A is movable in the up-and-down direction with respect to the first body members 54 and the fourth body member 46 with the first spring members 58 and the second spring members 48 interposed therebetween, vibrations generated when the traveling drive unit 3 travels or when the lifting device 10 ascends and descends are able to be prevented from being transmitted to an article. Furthermore, in the overhead transport vehicle 1 according to the present preferred embodiment, when a difference arises, in the second shock-absorbing mechanism 40 and each first shock-absorbing mechanism 50 that are connected to each other, between the distance between the base portion 10A and the fourth body member 46 and the distance between the base portion 10A and the corresponding first body member 54, the link mechanism 70 brings, closer to each other, the distance between the base portion 10A and the fourth body member 46 and the distance between the base portion 10A and the first body member 54 in the second shock-absorbing mechanism 40 and the first shock-absorbing mechanism 50 that are connected to each other, such that the occurrence of rolling motion in the base portion 10A is able to be reduced or prevented. Thus, tilting of the base portion 10A is able to be reduced or prevented, and swaying of a FOUP 90 is able to be reduced or prevented. Consequently, it is possible to reduce or prevent swaying of the FOUP 90 while reducing or preventing vibrations transmitted to the FOUP 90.

Because the link mechanism 70 connects together the two first shock-absorbing mechanisms 50 and the second shock-absorbing mechanism 40 that are arranged in the left-and-right direction (width direction) orthogonal to both of the front-and-rear direction in which the traveling drive unit 3 travels and the up-and-down direction, rolling motion in the width direction that occurs during travel on a curve or when the FOUP 90 is transferred in the lateral direction is able to be reduced or prevented. Furthermore, because the link mechanism 70 connects together the two first shock-absorbing mechanisms 50 arranged in the direction in which the traveling drive unit 3 travels, rolling motion in the front-and-rear direction that occurs due to acceleration or deceleration during travel is able to be reduced or prevented.

In the overhead transport vehicle 1 according to the present preferred embodiment, the lifting device 10 is suspended by the four belts 9, but is in a state of being suspended substantially at three locations by two connecting portions between the lifting device 10 and two belts 9 that are attached to the first shock-absorbing mechanisms 50 and the one fourth pin member 44 swingably connected in the second shock-absorbing mechanism 40. Thus, an effect similar to that in the case of being suspended by three belts 9 is obtained, such that the lifting device 10 is able to be more stably suspended. Furthermore, even if one belt 9 has been cut for some reason, the suspended state is able to be maintained, and thus the safety level is able to be increased more than in the case of being actually suspended by three belts 9.

In the foregoing, preferred embodiments have been described. However, the present invention is not limited to the preferred embodiments, and various modifications can be made without departing from the gist of the present invention.

In the preferred embodiments, an example has been described in which each first shock-absorbing mechanism 50 and the second shock-absorbing mechanism 40 that are arranged in the left-and-right direction are connected by the link mechanism 70, and the first shock-absorbing mechanisms 50 arranged in the front-and-rear direction are also connected to each other by the link mechanism 70. However, the present invention is not limited to this. For example, the overhead transport vehicle may be configured such that only each first shock-absorbing mechanism 50 and the second shock-absorbing mechanism 40 that are arranged in the left-and-right direction may be connected by the link mechanism 70. Even in this case, rolling motion that occurs in the width direction during travel on a curve or when the FOUP is transferred in the lateral direction is able to be reduced or prevented. Alternatively, the overhead transport vehicle may be configured such that only the first shock-absorbing mechanisms 50 arranged in the front-and-rear direction are connected to each other by the link mechanism 70. Even in this case, rolling motion in the front-and-rear direction that occurs due to acceleration or deceleration during travel is able to be reduced or prevented.

In the preferred embodiments or the modifications above, an example has been described in which each first shock-absorbing mechanism 50 is fixed to two shafts of the corresponding third shaft 73 and the corresponding fourth shaft 74. However, a configuration may be used in which the first shock-absorbing mechanism 50 is fixed only to the third shaft 73. However, when a shaft that is a portion of the link mechanism 70 fixed to each first body member 54 does not correspond to the direction in which the first spring members 58 and 58 are arranged (when the shaft does not lie on the above-described imaginary line) as in the present preferred embodiment, horizontal balance is able to be more easily maintained with the configuration in which the first shock-absorbing mechanism 50 is fixed to the two shafts of the third shaft 73 and the fourth shaft 74. This enables swaying of the FOUP 90 to be effectively reduced or prevented.

In the preferred embodiments or the modifications above, an example has been described in which the first spring members 58 and the second spring members 48 as vibration-isolating portions are disposed substantially directly below the positions of portions suspended by the belts 9. However, the present invention is not limited to this. A configuration may be used in which the positions of the portions suspended by the belts 9 and the positions of the vibration-isolating portions are displaced from each other.

Instead of or in addition to the first spring members 58 or the second spring members 48 in the preferred embodiment or the modifications above, for example, gel elastic bodies formed of silicone resin or the like may be disposed. Even in this case, vibrations and shock are able to be absorbed similarly to the case when the first spring members 58 or the second spring members 48 are disposed.

In the preferred embodiments or the modifications thereof as described above, an example has been described in which the lifting device 10 is suspended by the four belts 9. However, a configuration may be used in which the lifting device is suspended by three belts 9, for example. In this case, the belts 9 are attached at three locations to the connecting members 51 and 51 (see FIG. 3) and the fourth pin member 44 (see FIG. 4).

In the preferred embodiments or the modifications thereof described above, an example has been described in which the base portion 10A is movable in the up-and-down direction with respect to the first body members 54 or the fourth body member 46 as support portions by disposing each first shaft portion 57 as a shaft member through the corresponding first spring member 58 or by disposing each second shaft portion 47 as a shaft member through the corresponding second spring member 48. However, the present invention is not limited to this. For example, as a configuration for making the base portion movable in the up-and-down direction, a linear motion guide may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. An overhead transport vehicle comprising:
a body to travel along a track; and an elevator including a gripper to grip an article, and to be raised and lowered with respect to the body by a plurality of suspensions; wherein the elevator includes:
- a base including the gripper; and
- a plurality of shock absorbers each including a support to support the base to be vertically movable from below in a vertical direction via a vibration isolator, and to each of which at least one of the plurality of suspensions is attached;

the shock absorbers are connected by a link; and the link operates to ensure similarity of respective distances between the base and the support connected to each other in each of the shock absorbers.

2. The overhead transport vehicle according to claim 1, wherein the link connects together two of the plurality of shock absorbers arranged in a direction orthogonal to both of a direction in which the body travels and the vertical direction.

3. The overhead transport vehicle according to claim 2, wherein
- the elevator is suspended from the body by four of the plurality of suspensions;
- one of the plurality of shock absorbers further includes a swing that is swingably provided to the corresponding support; and
- two of the four of the plurality of suspensions are attached to the swing.

4. The overhead transport vehicle according to claim 1, wherein the link connects together two of the plurality of shock absorbers arranged in a direction in which the body travels.

5. The overhead transport vehicle according to claim 4, wherein
- the elevator is suspended from the body by four of the plurality of suspensions;
- one of the plurality of shock absorbers further includes a swing that is swingably provided to the corresponding support; and
- two of the four of the plurality of suspensions are attached to the swing.

6. The overhead transport vehicle according to claim 1, wherein the link connects together two of the plurality of shock absorbers arranged in a direction orthogonal to both of a direction in which the body travels and the vertical direction, and also connects together two of the shock absorbers arranged in the direction in which the body travels.

7. The overhead transport vehicle according to claim 6, wherein
- the elevator is suspended from the body by four of the plurality of suspensions;
- one of the plurality of shock absorbers further includes a swing that is swingably provided to the corresponding support; and
- two of the four of the plurality of suspensions are attached to the swing.

8. The overhead transport vehicle according to claim 1, wherein
- the elevator is suspended from the body by four of the plurality of suspensions;
- one of the plurality of shock absorbers further includes a swing that is swingably provided to the corresponding support; and
- two of the four of the plurality of suspensions are attached to the swing.

* * * * *